United States Patent
Yoshimura

(10) Patent No.: US 7,709,890 B2
(45) Date of Patent: May 4, 2010

(54) INSULATED GATE SEMICONDUCTOR DEVICE

(75) Inventor: Mitsuhiro Yoshimura, Ota (JP)

(73) Assignees: SANYO Electric Co., Ltd., Osaka (JP); SANYO Semiconductor Co., Ltd, Gunma (JP)

( * ) Notice: Subject to any disclaimer, the term of this patent is extended or adjusted under 35 U.S.C. 154(b) by 0 days.

(21) Appl. No.: 12/050,749

(22) Filed: Mar. 18, 2008

(65) Prior Publication Data

US 2008/0230810 A1    Sep. 25, 2008

(30) Foreign Application Priority Data

Mar. 23, 2007    (JP) .............................. 2007-076848

(51) Int. Cl.
*H01L 29/78* (2006.01)
(52) U.S. Cl. .............................. 257/330; 257/E29.262
(58) Field of Classification Search ......... 257/330–334, 257/133, 256, E29.262
See application file for complete search history.

(56) References Cited

U.S. PATENT DOCUMENTS

| | | | | |
|---|---|---|---|---|
| 5,821,580 A | * | 10/1998 | Kuwahara | 257/330 |
| 6,163,052 A | * | 12/2000 | Liu et al. | 257/334 |
| 6,180,966 B1 | * | 1/2001 | Kohno et al. | 257/173 |
| 6,501,129 B2 | * | 12/2002 | Osawa | 257/330 |
| 7,115,944 B2 | * | 10/2006 | Nakamura et al. | 257/328 |
| 7,230,300 B2 | * | 6/2007 | Onda et al. | 257/341 |
| 7,482,659 B2 | * | 1/2009 | Hotta | 257/355 |
| 2002/0167027 A1 | | 11/2002 | Fukuda et al. | |
| 2003/0062622 A1 | * | 4/2003 | Pavier et al. | 257/734 |
| 2007/0252200 A1 | * | 11/2007 | Ju | 257/330 |
| 2008/0164516 A1 | * | 7/2008 | Darwish | 257/329 |
| 2008/0191272 A1 | * | 8/2008 | Takeda | 257/330 |

FOREIGN PATENT DOCUMENTS

JP    2002-314086    10/2002

* cited by examiner

*Primary Examiner*—Nathan W Ha
(74) *Attorney, Agent, or Firm*—Morrison & Foerster LLP

(57) ABSTRACT

An isolation region is provided around a sense part. The isolation region is provided to have a depth that suppresses spread of a region with an uneven current distribution, which occurs at a peripheral edge of the sense part. Thus, in the sense part, an influence of the region with the uneven current distribution can be suppressed. Since the current distribution can be set more even throughout the sense part, the on-resistance in the sense part can be set closer to its designed value. Thus, a current ratio corresponding to a cell ratio can be obtained as designed. Consequently, current detection accuracy is improved.

9 Claims, 7 Drawing Sheets

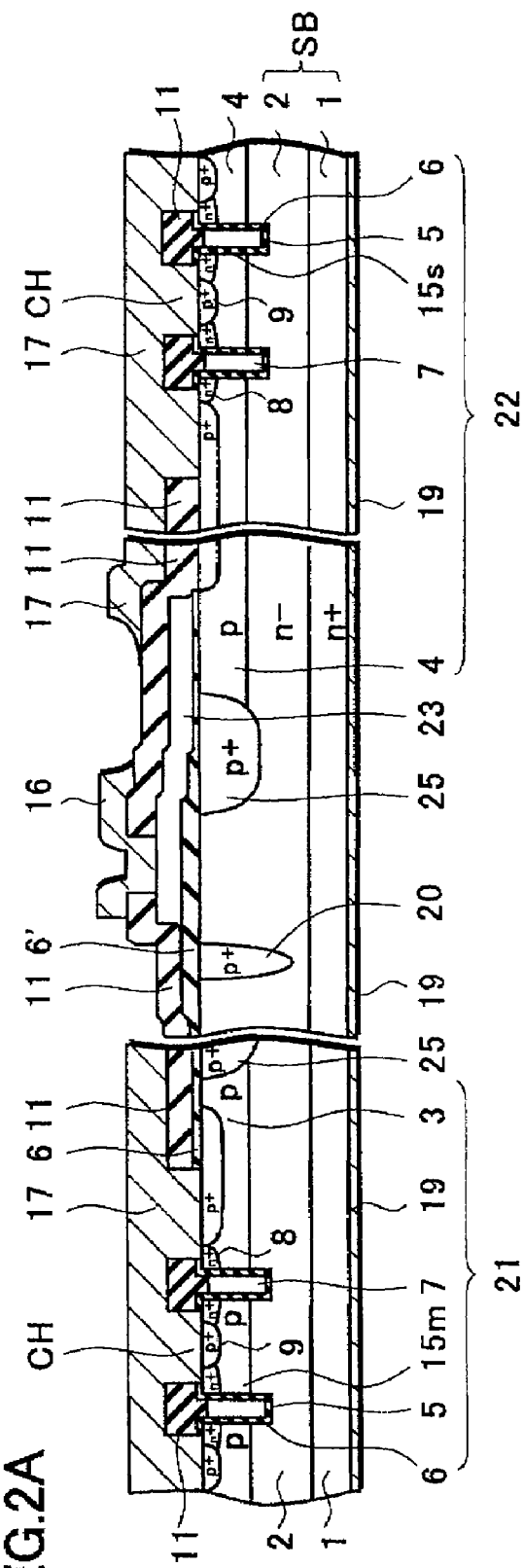
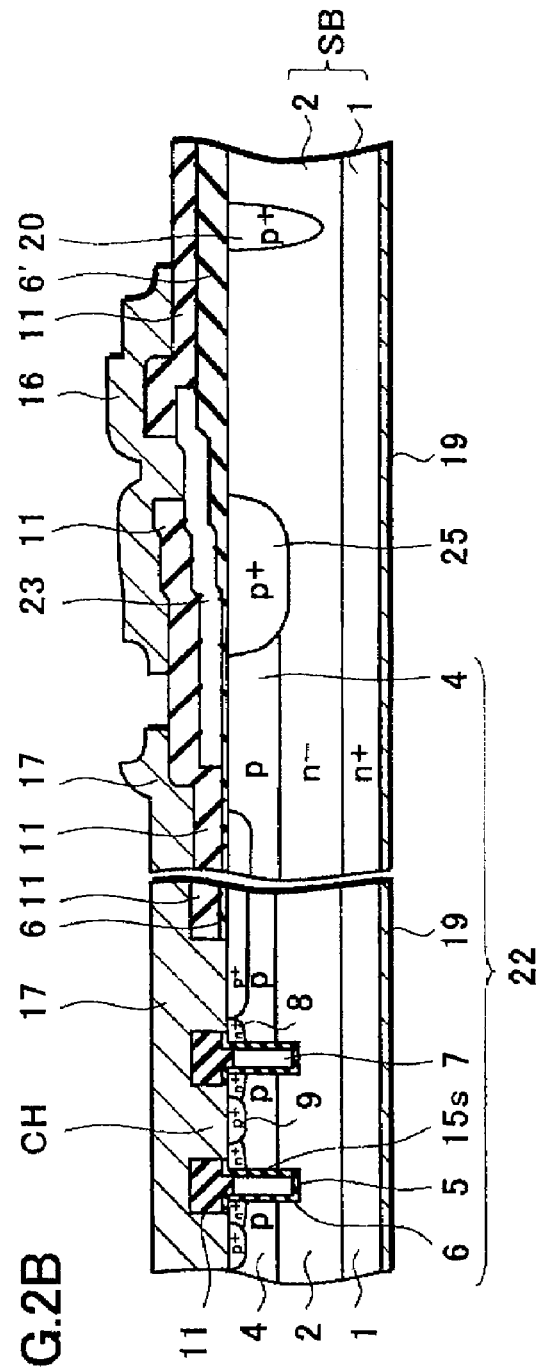

Prior Art

Prior Art

INSULATED GATE SEMICONDUCTOR DEVICE

This application claims priority from Japanese Patent Application Number JP2007-076848 filed on Mar. 23, 2007, the content of which is incorporated herein by reference in its entirety.

BACKGROUND OF THE INVENTION

1. Field of the Invention

The present invention relates to an insulated gate semiconductor device and more particularly relates to an insulated gate semiconductor device having improved detection accuracy with a sensing transistor which perform current detection in a main transistor.

2. Description of the Related Art

As a conventional insulated gate semiconductor device, there has been known an insulated gate semiconductor device in which a transistor and a sensing transistor are integrated into one chip. The transistor performs main operations and the sensing transistors perform current detection and the like in the transistor performing the main operations. This technology is described for instance in Japanese Patent Application Publication No. 2002-314086.

FIG. 7 is a plan view showing a MOSFET having a trench structure as an example of the conventional insulated gate semiconductor device. Note that metal electrode layers, such as a source electrode and a gate pad electrode, and an interlayer insulating film are omitted in FIG. 7.

As shown in FIG. 7, a main operation part 41, in which MOS transistors 35m performing main operations are disposed, and a sense part 42, in which sensing MOS transistors 35s are disposed, are integrated in one MOSFET chip. Moreover, channel regions 33 and 34 respectively of the main operation part 41 and the sense part 42 are isolated from each other with a predetermined space therebetween.

A semiconductor substrate 30 is formed, for example, by stacking an n− type semiconductor layer on an n+ type silicon semiconductor substrate, and serves as a drain region. The p type channel regions 33 and 34 are provided in a surface of the n− type semiconductor layer. Moreover, trenches are provided in the channel regions 33 and 34. Gate electrodes are buried in the trenches after the insides of the trenches are covered with insulating films. The MOS transistors 35m and 35s are disposed, for example, in a lattice pattern. The MOS transistors 35m and 35s provided in the respective channel regions 33 and 34 have the same configuration.

In the surface of the n− type semiconductor layer around the channel regions 33 and 34, a guard ring 45 having p+ type impurities diffused therein is disposed as needed. Furthermore, a shield metal 47 is provided in the outermost periphery of the chip.

The gate electrode which drives the sense part 42 is connected to the gate electrode in the main operation part 41 by a gate connection electrode 36 made of polysilicon or the like. A gate pad electrode 44 is provided on the surface of the substrate at a corner portion of the chip (the semiconductor substrate 30) and is connected to the gate connection electrode 36.

Specifically, the MOS transistors 35m and 35s respectively in the main operation part 41 and the sense part 42 are simultaneously driven, and a current is detected in the sense part 42. Thus, abnormalities such as an overcurrent in the main operation part 41 are monitored and controlled.

FIG. 8 is a cross-sectional view schematically showing a current path when the conventional MOSFET is on. FIG. 8 is a cross-sectional view taken along the line d-d in FIG. 7.

An n− type semiconductor layer 32 is stacked on an n+ type semiconductor substrate 31, and then the MOS transistors 35m and 35s are disposed at a cell ratio of, for example, 1000:1 in the respective channel regions 33 and 34 provided in the surface of the n− type semiconductor layer 32. Note that detailed illustration and description of the MOS transistors 35m and 35s are omitted here.

A current flowing into the semiconductor layer 32 from each cell of the MOS transistors 35m and 35s flows so as to spread not only in a vertical direction of the semiconductor layer 32 but also in a horizontal direction. In the drawing, current flows in about 45° direction are indicated by the arrows.

In the semiconductor layer 32 immediately below the channel regions 33 and 34, spreading current paths overlap with each other to form an approximately even current distribution. However, since there is not much overlap in edge portions of the channel regions 33 and 34, the current distribution becomes uneven in the edge portions compared with the vicinities of the centers (immediately below the channel regions 33 and 34).

Since the main operation part 41 which performs the main operation has a number of cells of the MOS transistors 35m, an area of a region immediately below the channel region 33 where the current distribution becomes even (hereinafter referred to as an even region CR1) is also large. Specifically, an area proportion of a region where the current distribution in the edge portion is uneven (hereinafter referred to as an uneven region CR2) is smaller than that of the even region CR1. In other words, the presence of the uneven region CR2 hardly has any influence.

Meanwhile, the sense part 42 has a very small number of the MOS transistors 35s compared with the number of the MOS transistors 35m in the main operation part 41 (for example, 1/1000). Although a region (an even region CR1) immediately below the channel region 34 is small in area, an uneven region CR2 is still generated as in the case of the main operation part 41. Thus, in the sense part 42, an area proportion of the uneven region CR2 to the even region CR1 is large. As a result, influence of the presence of the uneven region CR2 is increased.

In terms of designing, current capacities in proportion to the numbers of cells of the MOS transistors 35m and 35s should be obtained in the main operation part 41 and the sense part 42 respectively. If the respective current distributions are similarly even, on-resistance is also in proportion to the number of cells.

However, as described above, the presence of the uneven region CR2 has a significant influence in the sense part 42. Thus, for example, when comparison is made per unit channel region area (or unit cell), the uneven current distribution is more likely to occur in the sense part 42 than in the main operation part 41. Specifically, in the sense part 42, a problem occurs that the on-resistance is reduced to be lower than the designed value by the uneven current distribution.

FIG. 9 is a graph showing designed V-I characteristics (ideal values) in the main operation part 41 and the sense part 42 and actual V-I characteristics in the main operation part 41 and the sense part 42. The broken lines x and y indicate the characteristics of the ideal values in the main operation part 41 and the sense part 42 respectively, and the solid lines x' and y' indicate actual characteristics in the main operation part 41 and the sense part 42, respectively.

As is clear from FIG. 9, there is a problem that the current ratio corresponding to the cell ratio between the main operation part 41 and the sense part 42 cannot be obtained as designed. The problem is caused by the actual reduction of on-resistance in the sense part 42.

SUMMARY OF THE INVENTION

The invention provides an insulated gate semiconductor device that includes a semiconductor substrate of a first general conductivity type, a semiconductor layer of the first general conductivity type disposed on the semiconductor substrate, a first channel region of a second general conductivity type formed in the semiconductor layer, a second channel region of the second general conductivity type formed in the semiconductor layer, a first operation part comprising the first channel region and a plurality of first transistors each comprising a portion of the first channel region, a second operation part comprising the second channel region and a plurality of second transistors each comprising a portion of the second channel region, the second operation part being smaller than the first operation part, and an isolation region surrounding the second operation part.

BRIEF DESCRIPTION OF THE DRAWINGS

FIGS. 2A and 2B are cross-sectional views showing the insulated gate semiconductor device according to the embodiment of the present invention.

DETAILED DESCRIPTION OF THE INVENTION

With reference to FIGS. 1 to 4, an embodiment of the present invention will be described in detail by taking a MOSFET having an n channel trench structure as an example of an insulated gate semiconductor device.

Figure 1:
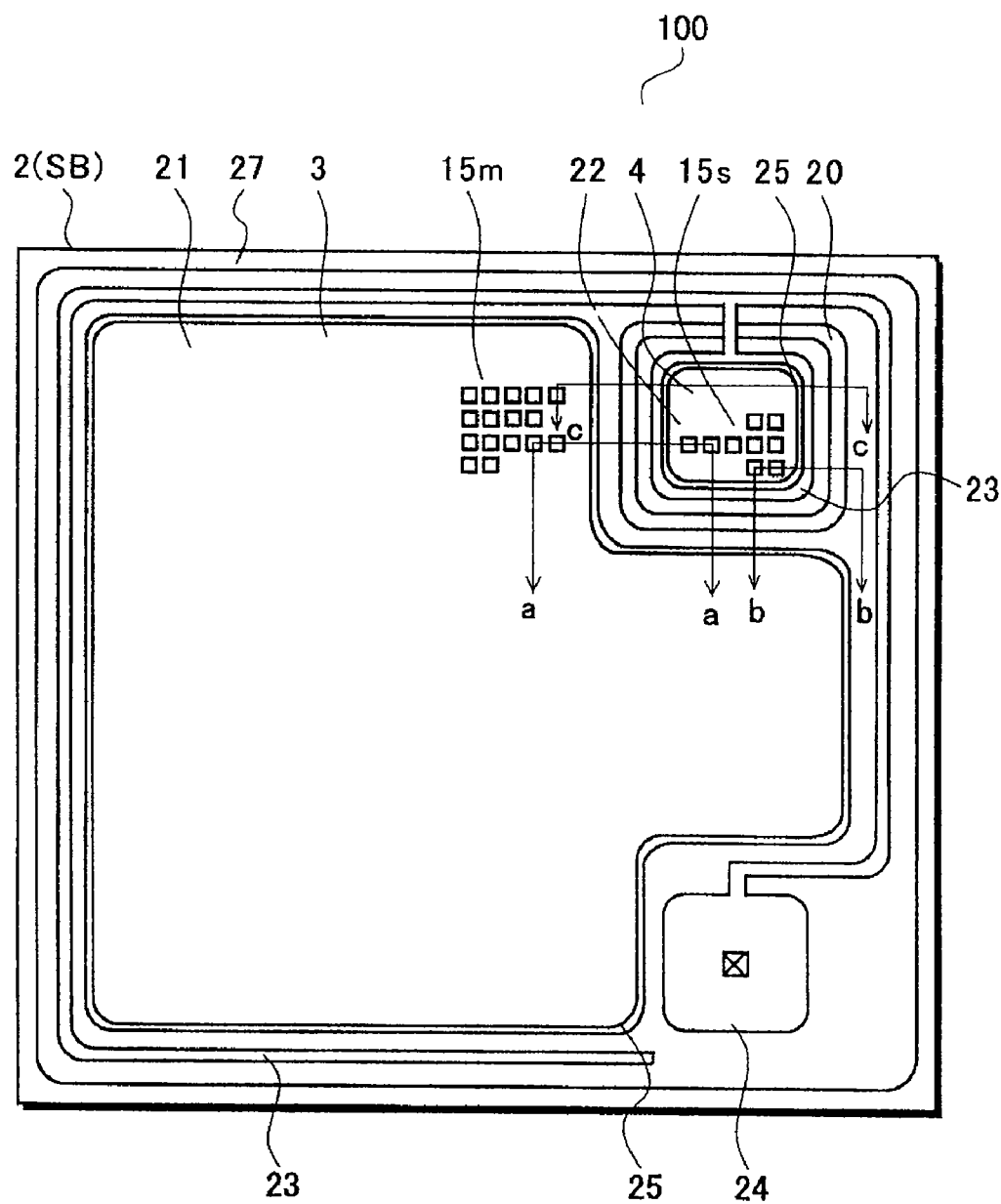
FIG. 1 is a plan view showing an insulated gate semiconductor device according to an embodiment of the present invention.

FIG. 1 is a plan view showing a MOSFET chip according to the embodiment of the present invention. Note that an interlayer insulating film and metal electrode layers (a source electrode, a gate pad electrode and a gate wiring) are omitted in FIG. 1.

A MOSFET 100 of the embodiment includes an n+ type semiconductor substrate 1, an n– type semiconductor layer 2, a first operation part 21, a second operation part 22, a first channel region 3, a second channel region 4, first transistors 15m, second transistors 15s and an isolation region 20.

It is noted that conduction types such as n+, n and n– belong in one general conductivity type, and conductivity types such as p+, p and p– belong in another general conductivity type.

A substrate SB is formed by stacking the n– type semiconductor layer 2 on an n+ type silicon semiconductor substrate (not shown) and serves as a drain region. The n– type semiconductor layer 2 is, for example, an epitaxial layer.

The first operation part 21 is a region where a number of the first transistors 15m which perform main operations are disposed. Meanwhile, the second operation part 22 is smaller in area than the first operation part 21 and is a region where a small number of the second transistors 15s which perform sensing of the first transistors 15m are disposed.

Although not shown in detail in FIG. 1, the first and second transistors 15m and 15s are disposed equally spaced apart in the first and second operation parts 21 and 22, respectively. Note that it is required to provide a source electrode also on the second operation part 22 for wire bonding. Specifically, an area required at least for the wire bonding should be secured for the second operation part 22. The first and second transistors 15m and 15s have the same configuration and are simultaneously operated. Moreover, a current in the second transistors 15s is detected by a control IC (not shown) to monitor and control a state of the first transistors 15m. In this embodiment, the first operation part 21 and the second operation part 22 will be hereinafter referred to as a main operation part 21 and a sense part 22, respectively.

In a surface of the n– type semiconductor layer 2 in the main operation part 21 and the sense part 22, a first channel region 3 and a second channel region 4 are provided, which correspond to the main operation part 21 and the sense part 22, respectively. The first and second channel regions 3 and 4 in this embodiment are, for example, diffusion regions obtained by implanting and diffusing p type impurities into the surface of the n– type semiconductor layer.

Note that, in this embodiment, the main operation part 21 is the region extended to an end of the first channel region 3 and the sense part 22 is the region extended to an end of the second channel region 4.

A gate connection electrode 23 extended around the main operation part 21 (the first channel region 3) and the sense part 22 (the second channel region 4) is made of polysilicon or the like and is connected to a common gate electrode (not shown here) for both of the main operation part 21 and the sense part 22. The gate connection electrode 23 is extended to a gate pad formation region 24 outside the main operation part 21, and is connected to a gate pad electrode (not shown) which is provided above the n– type semiconductor layer 2 in the gate pad formation region 24 with an insulating film interposed inbetween.

Thus, the same gate voltage is applied to the main operation part 21 and the sense part 22 at the same time.

The isolation region 20 is provided around the sense part 22. The isolation region 20 is, for example, a p type high concentration impurity region, which is provided so as to completely surround the sense part 22 with a space from a periphery of the second channel region 4 in the sense part 22. The isolation region 20 is also extended below the gate connection electrode 23 at the portion where electrodes for the sense part 22 and the main operation part 21 are connected. The isolation region 20 can prevent reduction of on-resistance caused by an uneven current distribution in the sense part 22.

FIGS. 2A and 2B are cross-sectional views showing the MOSFET 100 in FIG. 1. FIG. 2A is a cross-sectional view taken along the line a-a in FIG. 1. FIG. 2B is a cross-sectional view taken along the line b-b in FIG. 1. Note that the relative dimensions of the components shown in FIGS. 2A and 2B dot not necessarily represent those of actual devices. Rather, they are altered for better understanding of those structures.

As shown in FIGS. 2A and 2B, the substrate SB formed, for example, by stacking the n− type semiconductor layer 2 on the n+ type silicon semiconductor substrate 1 is used as the drain region. On the surface of the n− type semiconductor layer 2, the p type first and second channel regions 3 and 4 are provided, which correspond to the main operation part 21 and the sense part 22, respectively.

In this embodiment, each of the MOS transistors 15m and 15s has a trench structure. Each of trenches 5 has a depth of penetrating each of the first and second channel regions 3 and 4 and of reaching the n− type semiconductor layer 2. An inner wall of each trench 5 is covered with a gate insulating film (for example, an oxide film) 6 and each gate electrode 7 is provided by filling the trench 5 with polysilicon or the like. The gate electrode 7 is connected to a gate pad electrode through the gate connection electrode 23 provided on an insulating film 6' around the main operation part 21 and the sense part 22.

In surfaces of the first and second channel regions 3 and 4 adjacent to the trenches 5, n+ type source regions 8 are formed. Moreover, in the surfaces of the first and second channel regions 3 and 4 between the source regions 8 adjacent to each other, p+ type body regions 9 are provided.

An interlayer insulating film 11 made of a BPSG (Boron Phosphorus Silicate Glass) film or the like is provided so as to cover the gate electrodes 7. A source electrode 17 comes into contact with the source regions 8 and the body regions 9 through contact holes CH provided in the interlayer insulating film 11.

Moreover, in the surface of the n− type semiconductor layer 2 around the first and second channel regions 3 and 4, a guard ring 25 in which p+ type impurities are diffused is disposed as needed. Furthermore, in the outermost periphery of the chip, a shield metal 27 is provided (see FIG. 1).

The source electrode 17 is provided adjacent to the gate pad formation region 24 (see FIG. 1). A gate pad electrode (not shown) provided in the gate pad formation region 24 is formed of the same metal electrode layer as that of the source electrode 17. The source electrodes 17 in the main operation part 21 and the sense part 22 are separated from each other but electrically connected to the MOS transistors 15m and 15s, respectively.

On the gate connection electrode 23 surrounding the first channel region 3, a ring-shaped gate wiring 16 is provided so as to overlap with the electrode. Furthermore, a drain electrode 19 is provided on a rear surface of the substrate 1 by metal evaporation or the like.

Figure 8:
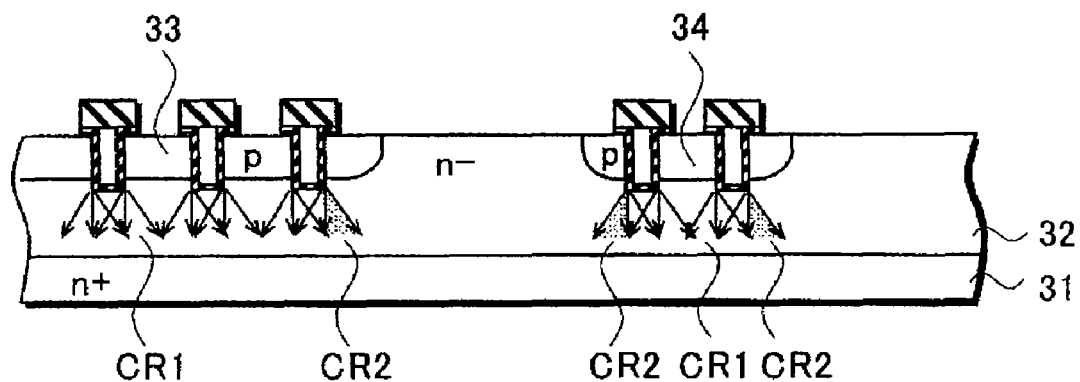
FIG. 8 is a cross-sectional view schematically showing the conventional insulated gate semiconductor device.

The isolation region 20 is provided around the second channel region 4 in the sense part 22 with a space from the end of the second channel region 4. The isolation region 20 is provided to have a depth that prevents a current, which flows from the second channel region 4 into the n− type semiconductor layer 2, from spreading in a horizontal direction in the substrate surface. For example, the depth of the isolation region 20 in this embodiment is enough to cut the horizontal component of the 45° current flow shown in FIG. 8. To be more specific, the isolation region 20 is provided more deeply than the second channel region 4.

Figure 3:
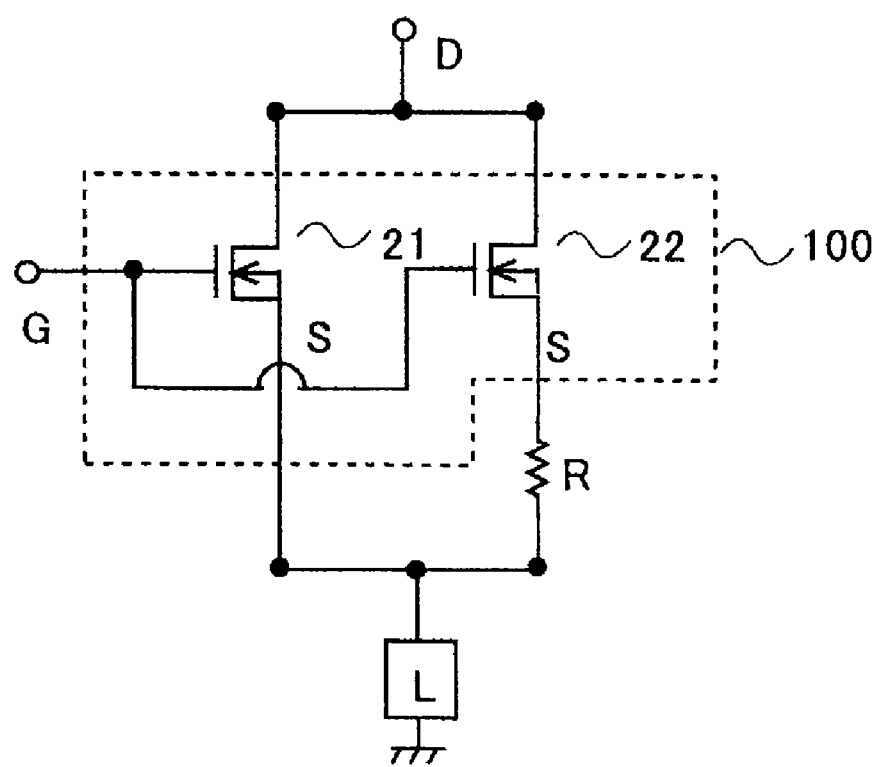
FIG. 3 is a circuit diagram showing the insulated gate semiconductor device according to the embodiment of the present invention.

FIG. 3 is a circuit diagram showing an application example of the MOSFET 100 shown in FIG. 1. In the MOSFET 100 of this embodiment, the main operation part 21 and the sense part 22, in which the transistors for sensing the current in the main operation part 21 are disposed, are integrated into one chip. The sense part 22 and the main operation part 21 are simultaneously operated by the same gate voltage applied at the same time.

As shown in FIG. 3, the MOS transistors 15s in the sense part 22 and the MOS transistors 15m in the main operation part 21 share a drain D connected thereto and each of sources S is grounded through a load L. Between the source S in the sense part 22 and the load L, a resistor R is connected. For example, by measuring a voltage drop at both ends of the resistor R, a current flowing through the MOS transistors 15s in the sense part 22 is detected. The MOS transistors 15m in the main operation part 21 have the same configuration as those of the transistors in the sense part 22. Thus, by making a measurement in the sense part 22, an overcurrent and the like in the main operation part 21 are detected. The sense part 22 and the main operation part 21 have in common gate G connected to an unillustrated control IC or the like. When abnormalities such as the overcurrent are detected in the sense part 22, the control IC controls the MOS transistors 15m in the main operation part 21 (as well as the MOS transistors 15s in the sense part 22).

In this MOSFET 100, as described above, the respective MOS transistors 15m and 15s have the same configuration. Thus, from the result of detection in the sense part 22, a current in the main operation part 21 is calculated based on a cell ratio between the MOS transistors 15m and 15s. Specifically, the MOSFET 100 is designed to obtain a current ratio between the main operation part 21 and the sense part corresponding to a cell ratio thereof.

Figure 7:
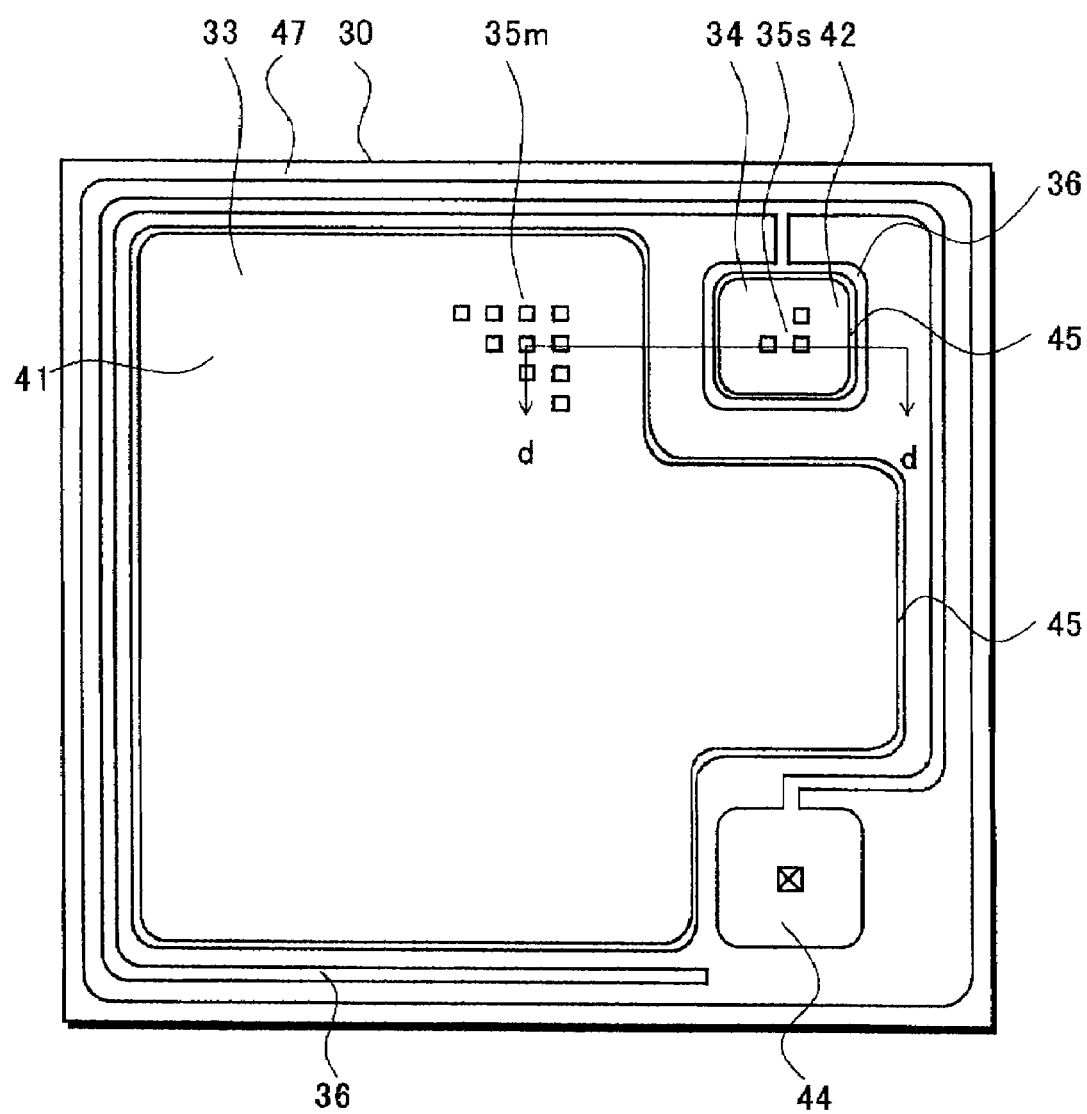
FIG. 7 is a plan view showing a conventional insulated gate semiconductor device.
Figure 9:
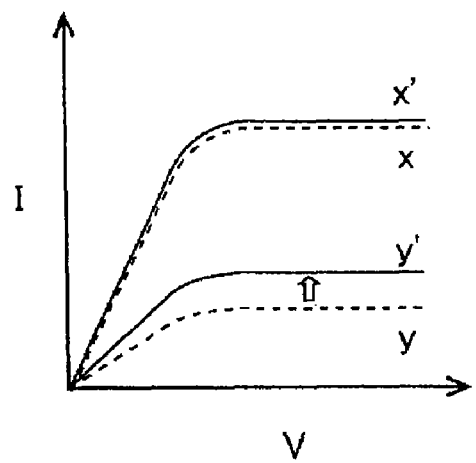
FIG. 9 is a characteristic diagram showing the conventional insulated gate semiconductor device.

However, the conventional structure shown in FIG. 7 has a problem that an on-resistance in the sense part 22 is actually smaller than a designed value and thus a current ratio corresponding to a cell ratio cannot be obtained (see FIG. 9).

Consequently, in this embodiment, the isolation region 20 surrounding the sense part 22 is provided to achieve an even current distribution in the sense part 22 and to prevent reduction in the on-resistance.

Figure 4:
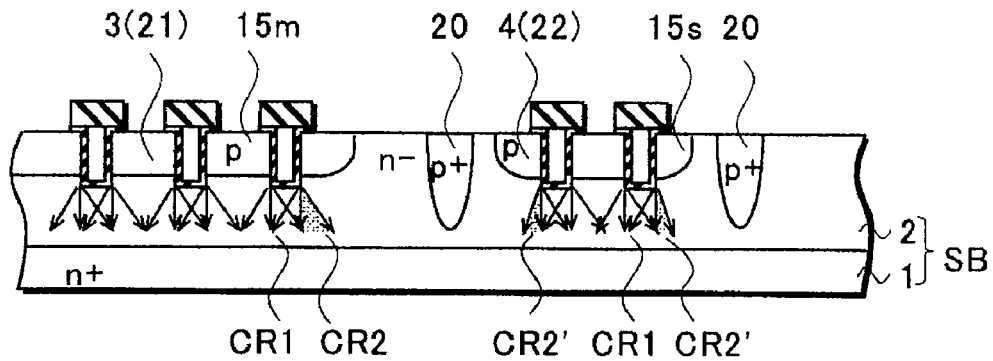
FIG. 4 is a cross-sectional view schematically showing the insulated gate semiconductor device according to the embodiment of the present invention.

With reference to FIG. 4, the description will be given. FIG. 4 is a cross-sectional view taken along the line c-c in FIG. 1, schematically showing the first and second channel regions 3 and 4. Although not shown in detail in FIG. 4, the MOS transistors 15m and 15s are disposed in the first and second channel regions 3 and 4, respectively (see FIGS. 2A and 2B).

Current passing through the first and second channel regions 3 and 4 flows into the n− type semiconductor layer 2 from each of lower ends of the channel regions 3 and 4. In this event, the current passing through cells of each of MOS transistors 15m and 15s flows into the n− type semiconductor layer 2 from each of lower ends of the first and second channel regions 3 and 4 so as to spread not only in a vertical direction of the substrate SB but also in a horizontal direction. In the drawing, a 45° current flow is shown as an example. Thus, vicinities of the centers of the first and second channel regions 3 and 4 become regions with an even current distribution (even regions CR1) and peripheral edges of the both channel regions 3 and 4 become regions with an uneven current distribution (uneven regions CR2 and CR2').

It is noted that the horizontal dimensional relationship between the isolation region 20 and the transistor cells is exaggerated in the drawing for better understanding of the components. In an actual device, the isolation region 20 is placed closer to the transistor cell at the edge of the sense part 22, so that some of the horizontal current flow is cut as shown in the arrows shown in the edge of the transistor cells of the sense part 22. This is also the case for the structures shown in FIGS. 5A and 5B.

In this embodiment, the isolation region 20 is disposed around the sense part 22. Accordingly, the current flowing from the peripheral edges of the second channel region 4 is prevented from spreading in the 45° direction by the isolation region 20. Thus, it is possible to suppress occurrence of the uneven regions CR2' at the peripheral edges of the second channel region 4. Moreover, an area proportion of the uneven regions CR2' to the even regions CR1 becomes smaller. Thus, there is not much influence of the uneven current distribution and the current distribution becomes more even all over the sense part 22.

Consequently, the on-resistance corresponding to the designed value can be obtained in the sense part 22. Moreover, the current ratio corresponding to the cell ratio can be obtained in the main operation part 21 and the sense part 22. Therefore, current detection accuracy is improved.

Note that the isolation region 20 is the region for suppressing the spread of the current at the peripheral edges of the second channel region 4. Thus, the deeper the isolation region 20 is, the higher the effect of suppressing the spread of the current is.

Therefore, as the depth of the isolation region 20, a depth reaching the bottom of the n− type semiconductor layer 2 or reaching the n+ type semiconductor substrate 1 is preferable. However, in the case where the isolation region 20 is formed of an impurity diffusion region, the deeper the isolation region 20 is, the more the diffusion is extended also in a horizontal direction of the substrate SB. As a result, a width of the isolation region 20 is increased. In this embodiment, the width of the isolation region 20 has no influence on the effect of suppressing the uneven regions CR2'. Accordingly, it is preferable that, for example, the isolation region 20 can be disposed between the main operation part 21 and the sense part 22 while maintaining the conventional pattern for the both parts. Moreover, even if the pattern is to be changed, an increase in a chip size should be avoided and the isolation region 20 preferably has a small width.

Since the main operation part 21 has a number of cells of the MOS transistors 15m, an area of the even regions CR1 is also large. Specifically, an area proportion of the uneven regions CR2 to the even regions CR1 becomes smaller.

Even in this embodiment, the uneven regions CR2' may occur in the sense part 22. However, there is no problem as long as the area of the uneven regions is negligibly small compared with the even regions CR1 of the sense part 22.

Therefore, when the isolation region 20 is formed of the impurity diffusion region, the depth thereof is accordingly selected so as not to increase the width thereof more than necessary and to prevent the spread of the current path from inducing the influence of the uneven current distribution.

Figure 5A:
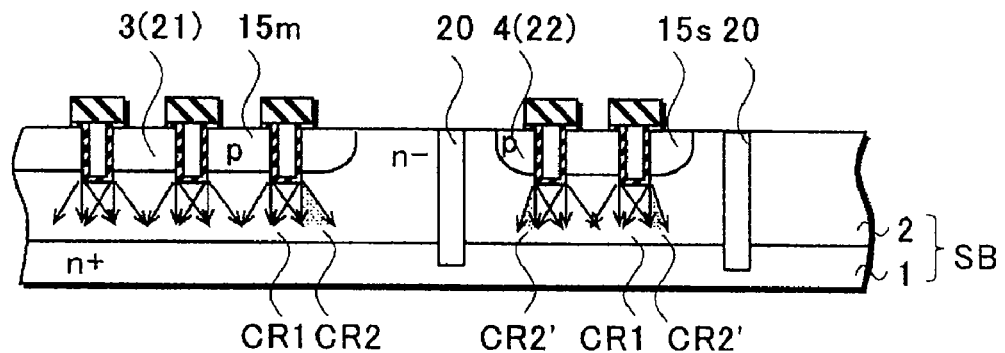
FIGS. 5A and 5B are cross-sectional views schematically showing the insulated gate semiconductor device according to the embodiment of the present invention.
Figure 5B:
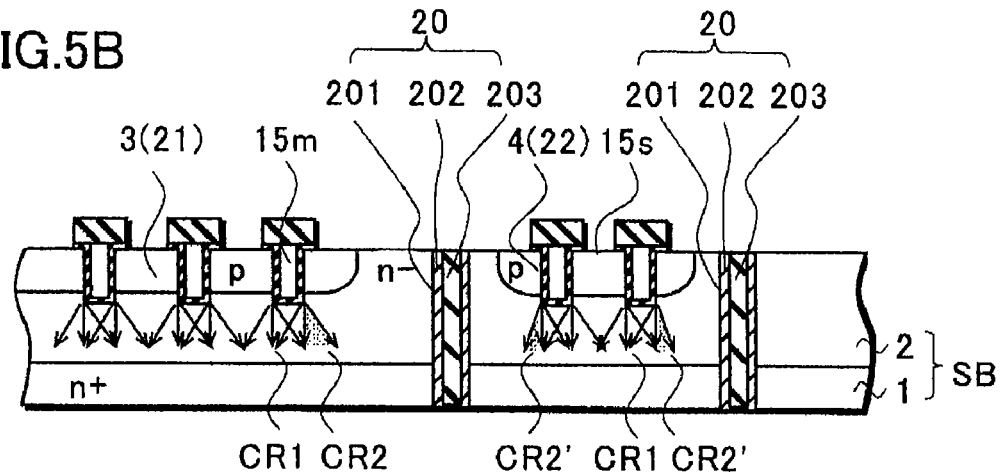

FIGS. 5A and 5B are cross-sectional views showing another form of the isolation region 20. The same constituent components as those shown in FIG. 4 are denoted by the same reference numerals and description thereof will be omitted.

The isolation region 20 is not limited to the p type impurity region but may be formed of an insulating material.

For example, FIG. 5A shows the case where the isolation region 20 is formed of an insulating layer. The insulating layer is formed by forming trenches around the sense part 22 and oxidizing insides of the trenches or by depositing insulating films in the trenches. The formation of the trenches makes it possible to form the isolation region 20 reduced in size without increasing the width of the isolation region 20 in the horizontal direction of the substrate even if the isolation region 20 has a depth reaching the n+ type semiconductor substrate 1, for example, as shown in FIG. 5A.

By forming the isolation region 20 deeper (for example, the depth reaching the n+ type semiconductor substrate 1), uneven regions CR2' can be suppressed compared with the case shown in FIG. 4.

Moreover, FIG. 5B shows the case where a through-holes 201 are used.

The through-holes 201 are provided so as to penetrate the n− type semiconductor layer 2 and the n+ type semiconductor substrate 1, and inner walls thereof are covered with insulating films 202. In the through-holes 201, conductive materials 203 such as copper (Cu) are buried. Moreover, insulating materials may be buried in the through-holes 201.

Also in this case, the isolation region 20 can be formed to have a small width even if the depth thereof is large. Thus, it is possible to avoid a pattern change or an increase in the chip size due to formation of the isolation region 20.

Figure 6:
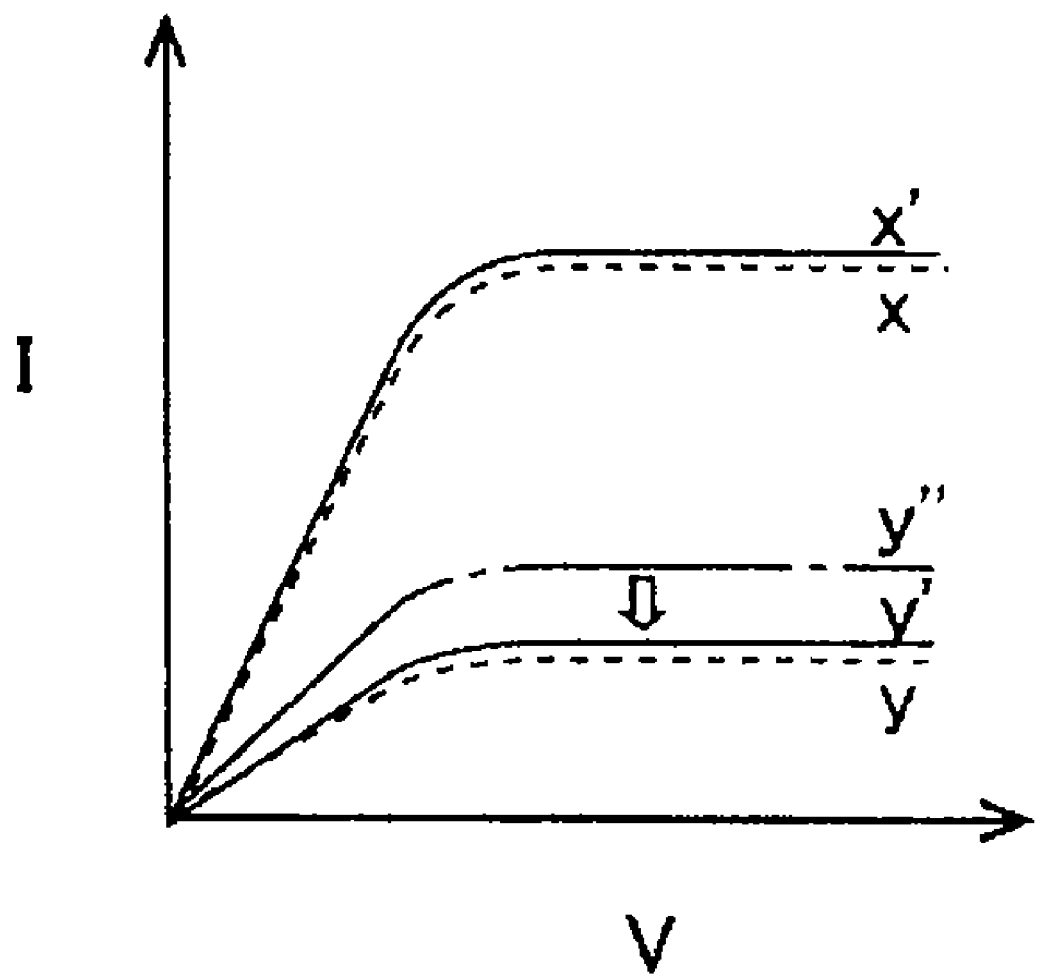
FIG. 6 is a characteristic diagram showing the insulated gate semiconductor device according to the embodiment of the present invention.

FIG. 6 is a graph showing V-I characteristics according to this embodiment.

The broken lines x and y indicate designed V-I characteristics (ideal values) in the main operation part 21 and the sense part 22, and the solid lines x' and y' indicate actual V-I characteristics in the main operation part 21 and the sense part 22, respectively. Moreover, the dashed line y" indicates V-I characteristics in the sense part having the conventional structure.

As is clear from FIG. 6, according to this embodiment, the on-resistance (slope of the V-I characteristics) which has been reduced by the influence of the uneven current distribution in the conventional structure (the dashed line y") is increased and the V-I characteristics (the solid line y) approximately close to the designed values (the ideal values: see the broken line y) can be obtained.

Although the embodiment of the present invention has been described above by taking the n channel MOSFET, the same effects can be achieved by using a p channel MOSFET having a conductivity type reversed. Furthermore, the present invention is not limited to the MOSFET having the trench structure but can be similarly implemented by using a MOSFET having a planar structure, in which a gate electrode 7 is disposed in a surface of an n− type semiconductor layer 2 with a gate insulating film 6 interposed inbetween.

According to the present invention, first, the isolation region surrounding the second operation part (the sense part) smaller in area than the first operation part (the main operation part) is provided to suppress the spread of the uneven region CR2 of the current distribution. Thus, the area proportion of the uneven region CR2 to the even region of the current distribution can be reduced. Therefore, it is possible to prevent reduction in the on-resistance per unit cell (unit channel region area) in the second operation part.

Thus, the on-resistance corresponding to the ratio of the number of cells between the first operation part (the main operation part) and the second operation part (the sense part) can be obtained as designed. Specifically, the current ratio can be obtained as designed in the first operation part and the second operation part. Thus, the current detection accuracy is improved.

Secondly, the depth of the isolation region is selected so as to set the same current per unit cell (area) in the first operation part and the second operation part. Accordingly, the current ratio between the first operation part and the second operation part can be set as designed. The effect of suppressing the uneven region CR2 varies according to the depth of the isolation region. However, selection of a proper depth makes it possible to improve the current detection accuracy.

Third, by adopting the impurity region as the isolation region, the spread of the uneven region CR2 can be easily suppressed without complicating the steps.

Fourth, by adopting the insulating layer as the isolation region, the isolation region can be reduced in size even if the isolation region is deep and the increase in the chip size can be prevented.

Fifth, by forming the isolation region by use of the through-holes, which penetrate the semiconductor layer and the semiconductor substrate, and the insulating films provided on side walls of the through-holes, the isolation region can be reduced in size and the increase in the chip size can be prevented.

What is claimed is:

1. An insulated gate semiconductor device comprising:
   a semiconductor substrate of a first general conductivity type;
   a semiconductor layer of the first general conductivity type disposed on the semiconductor substrate;
   a first channel region of a second general conductivity type formed in the semiconductor layer;
   a second channel region of the second general conductivity type formed in the semiconductor layer;
   a first operation part comprising the first channel region and a plurality of first transistors each comprising a portion of the first channel region, the first transistors comprising corresponding trenches formed in the first channel region;
   a second operation part comprising the second channel region and a plurality of second transistors each comprising a portion of the second channel region, the second operation part being smaller than the first operation part, the second transistors comprising corresponding trenches formed in the second channel region; and
   an isolation region surrounding the second operation part and penetrating into the semiconductor layer and physically in contact with neither the first channel region nor the second channel region,
   wherein the isolation region penetrates deeper into the semiconductor layer than the trenches of the first and second transistors.

2. The insulated gate semiconductor device of claim 1, wherein the isolation region is deep enough to suppress a horizontal spread of a current flowing into the semiconductor layer from the second channel region.

3. The insulated gate semiconductor device of claim 1, wherein the isolation region is deeper than the second channel region.

4. The insulated gate semiconductor device of claim 1, wherein the isolation region comprises an insulating layer.

5. The insulated gate semiconductor device of claim 1, wherein the isolation region comprises a high concentration impurity region of the second general conductivity type.

6. The insulated gate semiconductor device of claim 1, wherein the isolation region comprises a through-hole penetrating the semiconductor layer and the semiconductor substrate and an insulating film formed on a side wall of the through-hole.

7. The insulated gate semiconductor device of claim 1, wherein the first and second transistors comprise gate electrodes connected to a common gate electrode terminal.

8. The insulated gate semiconductor device of claim 1, wherein the second transistors are configured to detect a current in the first transistors.

9. The insulated gate semiconductor device of claim 1, wherein the isolation region is deep enough to be physically in contact with the semiconductor substrate.

* * * * *